United States Patent [19]
Buoli et al.

[11] Patent Number: 5,463,360
[45] Date of Patent: Oct. 31, 1995

[54] MICROWAVE OSCILLATOR WITH IMPROVED PHASE NOISE CHARACTERISTIC

[75] Inventors: Carlo Buoli, Mirandola; Giovanni Mora, Fontanella; Tommaso Turillo, Milan, all of Italy

[73] Assignee: Siemens Telecomunicazioni S.p.A., Cassina dei Pecchi, Italy

[21] Appl. No.: 383,784

[22] Filed: Feb. 6, 1995

Related U.S. Application Data

[62] Continuation of PCT/EP93/01952 Jul. 22, 1993.

[30] Foreign Application Priority Data

Aug. 5, 1992 [IT] Italy .................................. MI92A1938

[51] Int. Cl.⁶ ........................................................ H03B 5/18
[52] U.S. Cl. .............. 331/96; 331/107 DP; 331/107 SL; 331/117 D
[58] Field of Search ............................ 331/96, 99, 107 DP, 331/107 SL, 117 D

[56] References Cited

U.S. PATENT DOCUMENTS

| | | | |
|---|---|---|---|
| 5,032,800 | 7/1991 | Galani et al. | 331/96 |
| 5,036,299 | 7/1991 | Dick et al. | 331/25 |
| 5,150,080 | 9/1992 | Bianchini et al. | 331/99 |

*Primary Examiner*—Siegfried H. Grimm
*Attorney, Agent, or Firm*—Herbert L. Lerner; Laurence A. Greenberg

[57] ABSTRACT

A microwave oscillator has a cavity which is excited with an active element. The phase noise characteristic of the oscillator is improved in that a frequency discriminator utilizes the same oscillator cavity. The waves transmitted and reflected by the cavity are measured, combined and detected by a pair of low noise diodes. The signals obtained are compared to produce a control signal for a phase shifter which is connected between the active element and the cavity. The cavity is preferably a dielectric resonator.

8 Claims, 1 Drawing Sheet

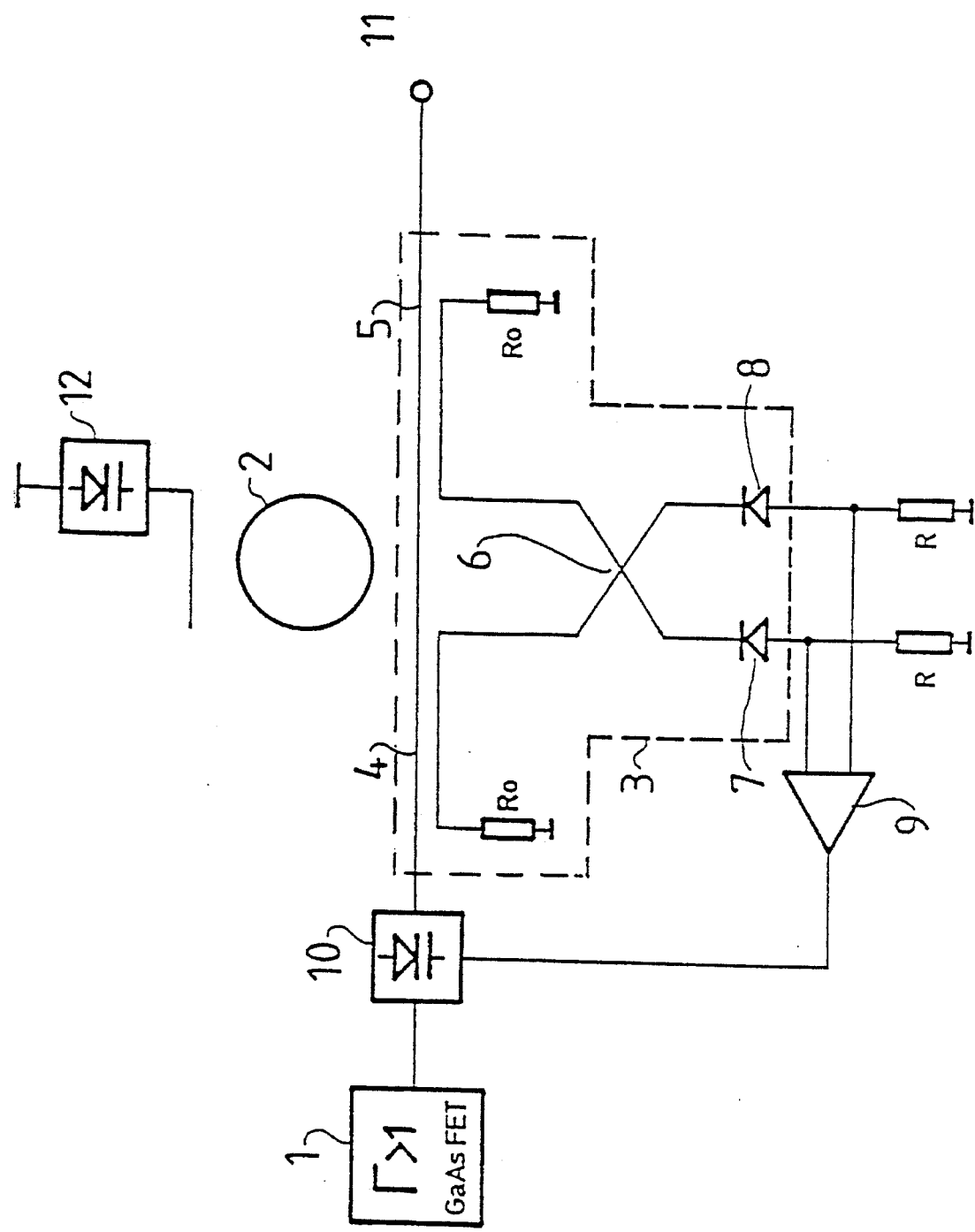

2

MICROWAVE OSCILLATOR WITH IMPROVED PHASE NOISE CHARACTERISTIC

CROSS-REFERENCE TO RELATED APPLICATION

This is a continuation of copending international application PCT/EP93/01952, which was filed on Jul. 22, 1993, and which designated the United States.

BACKGROUND OF THE INVENTION

1. Field of the Invention

The present invention relates to a microwave oscillator with improved phase noise characteristic near the carrier.

The invention has its preferred but nonlimiting application in telecommunications systems and in particular in digital radio link systems with low and medium capacity and therefore is illustrated and described in detail below with reference to this application but its employment is not to be understood as limited to that illustrated.

In low and medium capacity radio link systems it is constantly required to reduce the spectrum occupation even if this involves the use of more complicated modulation schemes.

It has been found that a low phase noise microwave oscillator is fundamental for this reduction, at this purpose a microwave multiloop frequency synthesizer is an optimal solution to obtain an oscillator like that.

But the circuitry complexity of a multiloop synthesizer is considerable because of the devices employed and among which are in particular frequency dividers, sampling phase detectors, phase comparators, crystal oscillators, etc.

2. Description of the Related Art

U.S. Pat. No. 5,036,299 to Dick et al. pertains to an apparatus and a method for reducing microwave oscillator output phase noise. The patent is herein incorporated by reference. With reference to FIG. 9 of the patent, an apparatus is disclosed for reducing noise in the output of a tunable microwave oscillator. The apparatus includes a feedback arrangement for providing a corrective signal. The feedback arrangement includes a resonator for receiving the output of the oscillator, and an active phase detector for detecting fluctuations in the output by comparing the output with the signal emitted by the resonator. The improvement in the prior art patent includes: means for suppressing the carrier of the signal emitted by the resonator, a radio-frequency amplifier for amplifying the suppressed carrier; the means and the amplifier are located between the resonator and the phase detector. The apparatus disclosed is added to a traditional tunable microwave oscillator based on a low-Q dielectric resonator (col. 4, lines 37 and 38) about the identical oscillator. The above-mentioned corrective signal obtained by the feedback arrangement is derived by a second high-Q dielectric resonator.

The main shortcoming of the cited invention is the excessive circuitry and the complexity thereof. That complexity is illustrated in FIG. 9 of the patent with the additional important consideration that two dielectric resonators are required.

OBJECT AND SUMMARY OF THE INVENTION

The purpose of the present invention is to overcome the shortcomings and limitations of the known art illustrated and in particular to provide a microwave oscillator comprising an active device and a resonant cavity with reduced phase noise near the carrier, simple in construction and highly stable to temperature, mechanical shocks and vibrations.

With the foregoing and other objects in view there is provided, in accordance with the invention, an improvement in a microwave oscillator of the type having a resonating cavity and an active device, and wherein a reflection coefficient of the active device is subjected to phase variations due to physical causes such as phase noise, temperature, and supply voltage fluctuations. The improvement comprises:

a phase shifter connected between the active device and the resonating cavity; and a discriminator circuit connected to the phase shifter, the discriminator circuit including means for receiving waves reflected from and transmitted through the resonating cavity, and means for forming a detecting signal proportional to an oscillator frequency offset relative to a resonant frequency of the resonating cavity;

the discriminator circuit controlling the phase shifter with the detecting signal for producing phase variations substantially equal in magnitude and opposite to phase variations in the reflection coefficient of the active device.

In other words, the objects of the invention are attained with a microwave oscillator comprising an active device, a resonating cavity, a phase shifter placed between the active device and the cavity, and a discriminator (or frequency demodulator) using the waves transmitted through and reflected from the resonating cavity for obtaining a signal proportional to the oscillator frequency offset as regards the resonant frequency of the cavity, which controls the phase shifter for producing phase variations equal and opposite to those occurred in the phase of the reflection coefficient.

In accordance with another feature of the invention, the discriminator circuit comprises:

a 90° 3dB power divider, the power divider having a first pair of ports with first and second ports and a second pair of ports with third and fourth ports, each of the ports of the pairs of ports being electrically insulated from one another;

a first directional coupler disposed between the phase shifter and the resonating cavity, the first directional coupler coupling waves reflected from the resonating cavity to the first port of the first pair of ports of the power divider;

a second directional coupler disposed between the resonating cavity and the output of the microwave oscillator, the second directional coupler coupling waves transmitted through the resonating cavity to the second port of the first pair of ports;

two low-noise detecting diodes respectively connected to the third and fourth ports of the second pair of ports of the power divider;

and two equal resistance means through which outputs of the two diodes are connected to ground.

In accordance with a further feature of the invention, the circuit includes integrator means in the form of a differential amplifier having two inputs, and wherein the outputs of the two diodes are respectively connected to the two inputs of the differential amplifier, the differential amplifier comparing voltages present at the outputs of the diodes for outputting the detected signal which controls the phase shifter.

In accordance with yet a further feature of the invention, the first and second directional couplers are two mutually identical 10 dB, one-fourth wave couplers, and including two resistors connecting the wave couplers to ground.

In accordance with an additional feature of the invention, the differential amplifier is connected as an active loop filter setting loop gain and bandwidth.

In accordance with yet an additional feature of the invention, the phase shifter is a varactor.

In accordance with an additional feature of the invention, the oscillator has a dielectric resonator. Preferably, also, the oscillator has a cavity with a low coupling coefficient. In accordance with the present invention there is provided a feedback of the noise produced by the active device previously extracted by a frequency discriminator for the purpose of reducing the oscillator phase noise near the carrier.

The characteristic of the oscillator is thus independent of the active device and depends only on the dielectric resonator with high Q and on the 1/f type low noise of the diodes present in the discriminator.

Other features which are considered as characteristic for the invention are set forth in the appended claims.

Although the invention is illustrated and described herein as embodied in a microwave oscillator with improved phase noise characteristic, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWINGS

The sole figure of the drawing is a diagrammatic illustration of a preferred embodiment of the present invention with a general diagram of an oscillator and a dielectric resonator incorporating a frequency discriminator.

DESCRIPTION OF THE PREFERRED EMBODIMENT

Referring now in detail to the figure, the dielectric oscillator comprises an active element or an active device 1 which consists of a field effect transistor or a GaAs FET in common-drain configuration. The active device 1 excites the cavity 2 of a dielectric resonator with relative dielectric constant $\epsilon_r = 38$ coupled by a slot-line to the microstrip circuit.

The oscillator output is available on a terminal 11 and there are provided in a known manner means 12 for compensation of the cavity temperature.

A phase shifter 10 is placed between the active device 1 and the cavity 2 controlled by a feedback loop described below.

In accordance with the present invention there is provided a discriminator or frequency demodulator 3 using the waves transmitted through and reflected from the cavity 2. The discriminator 3 includes two directional couplers 4 and 5, in particular two one-fourth wave length $\frac{1}{4}\lambda_c$, 10dB couplers connected by two terminating resistances Ro to ground, a 90° 3dB power divider indicated by reference numeral 6, and two low-noise 1/f type beam-lead detector diodes 7 and 8.

As it is evident from the drawing, the first directional coupler 4 is placed between the phase shifter 10 and the resonating cavity 2, and it couples the waves reflected from the resonating cavity 2 to a first port of the power divider 6, belonging to a first pair of ports electrically insulated from each other. A second directional coupler 5 is placed between the resonating cavity 2 and the output terminal 11, and it couples the waves transmitted through the resonating cavity 2 to a second port of the first pair of isolated port of the power divider 6. The cathodes of the diodes 7 and 8 are coupled to a respective port of a second pair of isolated ports of the power divider 6. The anodes of the two diodes 7 and 8 are connected to ground through two equal resistances R.

The voltages present at the anodes of the diodes 7 and 8 are both proportional, directly or inversely, to the oscillator frequency offset relative to the cavity 2 resonating frequency.

A differential amplifier 9, which acts as an integrator, receives at the inverting and non-inverting inputs the outputs on the anodes of the two diodes 7 and 8, respectively. These voltages are compared in such a manner that the output of the amplifier 9 is proportional to the oscillator frequency offset (phase shift) with regard to the cavity frequency, and this output signal controls the phase shifter 10. The phase shifter is of the varactor type, and it is placed between the active device 1 and the cavity 2. In this manner the phase of the reflection coefficient of the active device can be varied in such a manner as to correct the phase transients. Consequently the differential amplifier 9 acts as an active low-pass loop filter which sets loop gain and bandwidth.

Due to the proposed configuration, if the reflection coefficient phase of the active device changes, e.g. following temperature, phase noise, or power supply variations, the phase shifter 10 introduces a phase variation equal (in magnitude) and opposite to that incurred, in such a manner as to minimize the difference between the voltages at the ends of the diodes.

In this manner the phase noise due to the active device is attenuated by a factor equal to the loop gain of the feedback circuit made up of the discriminator 3 and the integrator 9, and the residual phase noise is only that introduced by the diodes 7 and 8 and the operational amplifier 9.

It has been found that as the power incident on the diodes increases, the sensitivity of the frequency discriminator increases, just as the noise ratio increases, so that the noise contribution of the diodes does not change.

With the device proposed in accordance with the present invention, there is obtained a considerable improvement in the phase noise near the carrier, and in addition the frequency variations of the active device due to temperature are eliminated. The oscillator frequency is dependent only on the resonant cavity.

Typically, with an active device consisting of a GaAs FET and using Schottky diodes for the diodes 7 and 8 there is obtained a reduction on the order of 15dB near the carrier, and the stability of the oscillator is less than 5 ppm (parts per million) in the range from 0° C. to 50° C.

The addition of a demodulator circuit to the dielectric oscillator with resonator allows obtaining a direct microwave source with high frequency stability and low phase noise near the carrier, without requiring components such as frequency dividers, sampling phase detectors (SPD) and phase locked loop (PLL), with greater compactness of the mechanical construction and reduced cost.

As reduction of phase noise depends on the noise of the diodes, which is the 1/f type, reducing this noise reduces correspondingly the oscillator phase noise.

In accordance with an alternative, non-illustrated embodiment of the present invention, the dielectric resonator can be replaced by a low coupling coefficient (Q) cavity, for example embodied by a resonator on alumina substrate.

There can thus be embodied for example a voltage controlled oscillator (VCO) in GaAs MMIC technology which comprises the active device, the phase shifter, the resonant cavity and the Schottky diodes.

The technique proposed by the invention allows to achieve not only low phase noise but also a considerable reduction of frequency drift and better stability in temperature, depending only on the dielectric resonator.

Due to the instantly disclosed invention there is obtained the typical performance of a highly complex synthesizer by means of a relatively simple modification of an oscillator with dielectric resonator.

We claim:

1. In a microwave oscillator of the type having a resonating cavity and an active device, and wherein a reflection coefficient of the active device is subjected to phase variations due to physical causes including phase noise, temperature, and supply voltage fluctuations, the improvement which comprises:

a phase shifter connected between the active device and the resonating cavity; and a discriminator circuit connected to said phase shifter, said discriminator circuit including means for receiving waves reflected from and transmitted through the resonating cavity, and means for forming a detecting signal proportional to an oscillator frequency offset relative to a resonant frequency of said resonating cavity;

said discriminator circuit controlling said phase shifter with the detecting signal for producing phase variations substantially equal in magnitude and opposite to phase variations in the reflection coefficient of the active device.

2. The microwave oscillator according to claim 1, wherein said discriminator circuit comprises: a 90° 3dB power divider, said power divider having a first pair of ports with first and second ports and a second pair of ports with third and fourth ports, each of said ports of said pairs of ports being electrically insulated from one another, a first directional coupler disposed between said phase shifter and the resonating cavity, said first directional coupler coupling waves reflected from the resonating cavity to said first port of said first pair of ports of said power divider;

a second directional coupler disposed between said resonating cavity and the output of said microwave oscillator, said second directional coupler coupling waves transmitted through the resonating cavity to said second port of said first pair of ports;

two low-noise detecting diodes respectively connected to said third and fourth ports of said second pair of ports of said power divider;

and two equal resistance means through which outputs of said two diodes are connected to ground.

3. The microwave oscillator according to claim 2, which further comprises integrator means in the form of a differential amplifier having two inputs, and wherein the outputs of said two diodes are respectively connected to said two inputs of said differential amplifier, said differential amplifier comparing voltages present at the outputs of the diodes for outputting the detected signal which controls said phase shifter.

4. The microwave oscillator according to claim 2, wherein said first and second directional couplers are two mutually identical 10 dB, one-fourth wave couplers, and including two resistors connecting said wave couplers to ground.

5. The microwave oscillator according to claim 3, wherein said differential amplifier is connected as an active loop filter setting loop gain and bandwidth.

6. The microwave oscillator according to claim 1, wherein said phase shifter comprises a varactor.

7. The microwave oscillator according to claim 1, wherein the oscillator is a dielectric resonator type oscillator.

8. The microwave oscillator according to claim 1, wherein said oscillator comprises a cavity with a low coupling coefficient.

\* \* \* \* \*